United States Patent
Cardinale

(10) Patent No.: US 6,368,942 B1
(45) Date of Patent: Apr. 9, 2002

(54) METHOD FOR FABRICATING AN ULTRA-LOW EXPANSION MASK BLANK HAVING A CRYSTALLINE SILICON LAYER

(75) Inventor: Gregory F. Cardinale, Oakland, CA (US)

(73) Assignee: EUV LLC, Santa Clara, CA (US)

( * ) Notice: Subject to any disclaimer, the term of this patent is extended or adjusted under 35 U.S.C. 154(b) by 0 days.

(21) Appl. No.: 09/540,585

(22) Filed: Mar. 31, 2000

(51) Int. Cl.[7] .......................... H01L 21/30; H01L 21/46
(52) U.S. Cl. ........................... 438/459; 438/455; 430/5; 378/35
(58) Field of Search ................................ 438/455, 459; 430/5, 325; 378/35

(56) References Cited

U.S. PATENT DOCUMENTS

| | | | |
|---|---|---|---|
| 2,326,059 A | * 8/1943 | Nordberg | 501/94 |
| 5,154,744 A | * 10/1992 | Blackwell et al. | 65/413 |
| 5,506,080 A | * 4/1996 | Adair et al. | 430/5 |
| 5,510,230 A | * 4/1996 | Tennant et al. | 430/325 |
| 6,048,652 A | * 4/2000 | Nguyen et al. | 430/5 |
| 6,159,643 A | * 12/2000 | Levinson et al. | 430/5 |
| 6,178,221 B1 | * 1/2001 | Levinson et al. | 378/35 |

OTHER PUBLICATIONS

Gianoulakis et al., "Thermal–Mechanical performance of Extreme Ultraviolet Lithographic Reticles", J. Vac. Sci. Technol. B., vol. 16 (6), p. 3440 (1998).*

Gianoulakis et al., "Thermal Management of EUV Lithography Masks Using Low–Expansion Glass Substrates", , Proceedings of the SPIE, vol. 3676, p. 598 (1999).*

Tong et al., Mask Substrate Requirements and Development for Extreme Ultraviolet Lithography (EUVL), Proceedings of the SPIE, vol. 3873, p. 421 (1999).*

Wolf and Tauber, "Silicon Processing for the VLSI Era", vol. 1, p 530, Lattice Press, 1986.*

* cited by examiner

*Primary Examiner*—Charles Bowers
*Assistant Examiner*—Asok Kumar Sarkar
(74) *Attorney, Agent, or Firm*—L. E. Carnahan; T. P. Evans

(57) ABSTRACT

A method for fabricating masks for extreme ultraviolet lithography (EUVL) using Ultra-Low Expansion (ULE) substrates and crystalline silicon. ULE substrates are required for the necessary thermal management in EUVL mask blanks, and defect detection and classification have been obtained using crystalline silicon substrate materials. Thus, this method provides the advantages for both the ULE substrate and the crystalline silicon in an Extreme Ultra-Violet (EUV) mask blank. The method is carried out by bonding a crystalline silicon wafer or member to a ULE wafer or substrate and thinning the silicon to produce a 5–10 μm thick crystalline silicon layer on the surface of the ULE substrate. The thinning of the crystalline silicon may be carried out, for example, by chemical mechanical polishing and if necessary or desired, oxidizing the silicon followed by etching to the desired thickness of the silicon.

12 Claims, 1 Drawing Sheet

US 6,368,942 B1

METHOD FOR FABRICATING AN ULTRA-LOW EXPANSION MASK BLANK HAVING A CRYSTALLINE SILICON LAYER

GOVERNMENT RIGHTS

The United States Government has rights in this invention pursuant to Contract No. DE-ACO4-94AL85000 between the United States Department of Energy and the Sandia Corporation for the operation of the Sandia National Laboratories.

BACKGROUND OF THE INVENTION

The present invention is related to the fabrication of mask blanks for lithographic applications, particularly to fabricating mask blanks for Extreme Ultra-Violet Lithography (EUVL) and more particularly to a method for fabricating EUVL mask blanks composed of an Ultra-Low Expansion (ULE) substrate with a crystalline silicon surface.

EUVL is a leading candidate for the next generation of lithographic systems for fabrication of semiconductor microelectronics. EUVL technology development is progressing toward insertion into the production of integrated circuits with critical dimensions of 70 nm. The key difference between EUVL and conventional lithography is that the EUVL employs 13.4 nm light and therefore requires reflective optics that are coated with multilayers, typically alternating layers of molybdenum and silicon (Mo/Si). Deposition of low defect, uniform multilayer coatings on mask blanks is an area of intense development. Also, development of mask blanks or substrates that enable inspection for defects is another area of current development.

Thermal management of EUVL masks or substrates has become an important field in view of the current development efforts relating to EUVL systems. ULE materials, such as glass substrates, which have thermal coefficient advantages compared to silicon substrates, are being considered for the thermal management in EUVL mask blanks. Also, the vast experience with fabrication and processing, including the defect detection and classification results that have been obtained using crystalline silicon substrate materials, render crystalline silicon a desirable material for EUVL masks. Since mask blank defect inspection is one of the most important factors in determining mask blank yield and, as a consequence cost, the use of ULE mask blanks with a crystalline silicon surface is of great value to the EUVL program.

Various techniques for bonding silicon wafers to silicon or other materials are known in the art and include thermal-compression, anodic, etc. The bonding of silicon to a substrate can also be carried out at various temperatures including room temperature bonding. See S. N. Farren's et al., Chemical Free Room Temperature Wafer to Wafer Direct Bonding, J. Electrochem. Soc. Vol. 142, No. 1, November 1995, 3949–3955.

The present invention provides a method that produces a mask blank which incorporates the thermal coefficient advantages of ULE substrates and the defect detection and classification advantages of crystalline silicon. The mask blanks composed of a ULE substrate with a crystalline silicon surface produced by the fabrication method of the present invention are applicable for EUVL systems now under development. Basically the fabrication method involves bonding a crystalline silicon wafer to a ULE wafer and thinning the crystalline silicon to a thickness of about 5–10 $\mu$m.

SUMMARY OF THE INVENTION

It is an object of the present invention to provide an Extreme Ultra-Violet Lithography (EUVL) mask blanks using Ultra-Low Expansion (ULE) mask substrates.

A further object of the invention is to provide an EUVL mask blank wherein defect detection can be effectively carried out.

Another object of the invention is to provide ULE/silicon (ULE/Si) Extreme Ultra-Violet (EUV) mask blanks.

Another object of the invention is to provide a method for fabricating mask blanks composed of an ULE substrate with a crystalline silicon surface.

Another object of the invention is to provide a mask blank which combines the advantages of ultra-low thermal expansion of selected materials such as glass, plastics, and ceramics with the defect inspection advantages of crystalline silicon.

Another object of the invention is to provide a method for fabricating EUVL mask blanks by bonding a crystalline silicon wafer to an ULE wafer and thinning the silicon wafer to a thickness of about 5–10 $\mu$m crystalline silicon film.

Other objects and advantages of the present invention will become apparent from the following description and accompanying drawings. The invention involves a method for the fabrication of ultra-low expansion/silicon extreme ultraviolet mask blanks. The ULE substrate enables the necessary thermal management in EUVL mask blanks while the silicon surface film on the substrate enables defect inspection, which is one of the most important factors in determining mask blank yield and as a consequence, cost, of the mask blank. By combining ULE/Si into a mask blank, there is produced an effective EUV mask blank on which reflective multilayers may be deposited for EUVL applications. Basically the method involves bonding a crystalline silicon wafer to an ultra-low expansion wafer such as selected glass, plastic or ceramic and then thinning the silicon to a desired thickness (e.g., 5–10 $\mu$m). The silicon can be thinned and polished by chemical and mechanical polishing and thermal oxidation followed by etching, where needed, to produce a crystalline silicon surface on the ULE substrate.

BRIEF DESCRIPTION OF THE DRAWINGS

The accompanying drawings, which are incorporated into and form a part of the disclosure, illustrate embodiments of the invention and together with the description, serve to explain the principles of the invention.

DETAILED DESCRIPTION OF THE INVENTION

The present invention is directed to a method for fabricating masks for Extreme Ultra-Violet Lithography (EUVL). The invention is based on two factors: first Ultra-Low Expansion (ULE) substrates are required for the necessary thermal management in EUVL mask blanks; and second the vast experience with fabrication and processing including defect detection and classification results that have been obtained using crystalline silicon substrate materials. Since Extreme Ultra-Violet (EUV) mask blank defect inspection is one of the most important factors in determining mask blank yield and as a consequence, cost, the use of EUV mask blanks with a crystalline silicon surface is of great value to the EUV systems. By combining the advantages of ULE substrates and crystalline silicon surfaces, thermal management and defect inspection problems for EUVL mask blanks can be resolved or greatly reduced. ULE material is defined as a material with a coefficient of thermal expansion <100 ppk/° K, and may be composed of selected glass, plastic or ceramic.

Figure 1A:
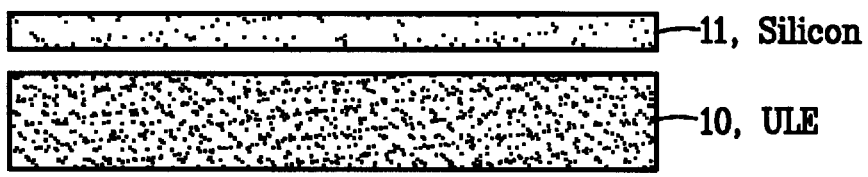
FIGS. 1A, 1B and 1C illustrate the method of the invention utilizing chemical mechanical polishing to thin a silicon wafer bonded to an ultra-low expansion wafer to produce the mask blank of FIG. 1C.
Figure 1B:
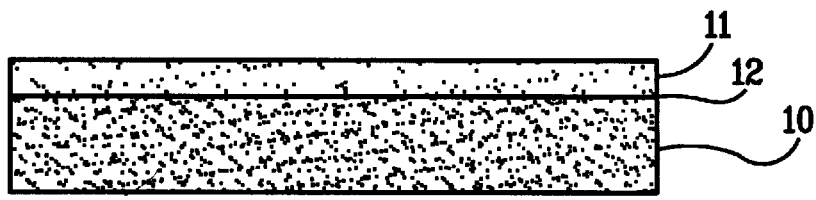
Figure 1C:

The method of the present invention is herein after described with reference to FIGS. 1A through 1E. In this described, and illustrated example of the method, a ULE wafer 10 and a crystalline silicon wafer 11 of the same diameter are provided, as shown in FIG. 1A, which may be for example about 8 inches in diameter. The ULE wafer may have, for example, a thickness of about 0.25 inches and the silicon wafer a thickness of about 0.025 inches (~650 µm), although the thickness of the ULE wafer may vary from about 0.2 inches to about 0.5 inches and the thickness of the silicon wafer from about 600 µm to about 800 µm. Next, the silicon wafer 11 is bonded to ULE wafer 10 as indicated at 12, as shown in FIG. 1B, by conventional bonding techniques such as anodic, thermal compression, room temperature, etc., each of which is commonly known in integrated circuit fabrication. The silicon wafer 11 is then ground and polished using for example, chemical and mechanical polishing to a thickness of ~5 µm to ~10 µm for example as shown in FIG. 1C, whereby a mask blank composite at 13, composed of a ULE substrate with a crystalline silicon surface having a 5–10 µm thickness is produced.

Figure 1D:
FIGS. 1D and 1E illustrate the oxidation and etching operations on a polished silicon wafer, such as in FIG. 1C, for thinning the silicon to produce the ULE/Si mask blank of FIG. 1E.
Figure 1F:
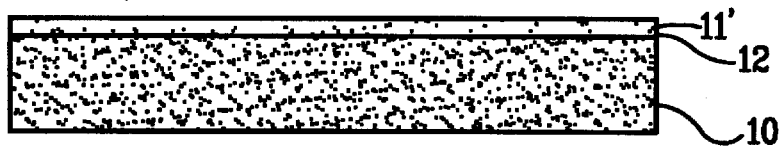

Additional silicon wafer thinning, if necessary, is achieved by oxidizing the silicon 11 to produce an $SiO_2$ film 14 on silicon 11 as shown in FIG. 1D followed by etching with a buffered hydrofluoric acid etch to produce, for example, a 5 µm silicon thickness, 11' as shown in FIG. 1E. In fact, oxidation "thinning" is often used to reduce the number of defects (caused by polishing) in silicon wafers used in high volume integrated circuit manufacturing. Note that the final silicon surface, 11 and 11' of FIGS. 1C and 1E are crystalline.

As set forth above, the primary advantage of crystalline silicon as the top surface is the knowledge base of defect detection and defect mitigation that has been performed on bare crystalline silicon to date. If, on the other hand, silicon is deposited on to the ULE substrate using one of many typical vapor deposition techniques (e.g., sputtering, evaporation, CVD, etc.) then the deposited silicon will likely have an amorphous structure, i.e., amorphous silicon (a-Si) which is undesirable.

One concern associated with the mask blanks produced by the method of this invention is the thermal stress that develops during a thermally activated wafer bonding process. Typically, a thermal compression wafer bonding process operates at around 400° C. Thermal stresses result from cooling two materials with different coefficients of linear thermal expansion ($\alpha_L$). In addition, the $\alpha_L$ of silicon and ULE materials vary with temperature. However, ULE material can be fabricated to have a desired $\alpha_L$ at a specific temperature by varying to amount of material components. Since the ULE material may, for example, be a ceramic alloy consisting primarily of fused quartz and $TiO_2$ and the $\alpha_L$ at a given temperature is a strong function of % $TiO_2$, the $\alpha_L$ can be tailored to match silicon within a specific temperature range. By way of example, $TiO_2$ might be present in a percentage of between about 0.1% to about 10%. Also, since silicon wafers can be bonded at room temperature, as set forth in the above referenced article by S. N. Farrens, et. al., the thermal stress concerns may be reduced dramatically. It is also possible to reduce interface stresses by thermally growing an oxide on the silicon surface which would serve as a "pad" oxide by being more closely matched in $\alpha_L$ to the ULE material, compared to silicon. Thus, after the silicon wafer has been thinned to the desired thickness as shown in FIGS. 1C and 1E, a film of $SiO_2$ may be deposited on the silicon 11'.

It has thus been shown that the method of the present invention enables fabrication of ULE/Si EUV mask blanks. By the present method a mask blank is fabricated using a ULE substrate with a crystalline silicon surface which provides the necessary thermal management and defect inspection required by EUVL mask blanks.

While a particular sequence of operations using particular techniques, parameters and materials has been described and illustrated to exemplify and teach the principles of the invention such are not intended to be limiting. Modifications and changes may become apparent to those skilled in the art and it is intended that the invention be limited only by the scope of the appended claims.

What is claimed is:

1. A method for fabricating mask blanks for use in extreme ultraviolet lithography, comprising;
   providing a wafer of an ultra-low expansion material;
   providing a wafer of crystalline silicon;
   bonding the wafer of crystalline silicon to the wafer of ultra-low expansion material;
   reducing the thickness of the exposed surface of the wafer of crystalline silicon to a thickness of between about 5 µm and 10 µm;
   polishing the exposed surface of the reduced thickness crystalline silicon wafer thereby forming a mask blank of ultra-low expansion material with a crystalline silicon surface; and
   forming a silicon oxide film on the crystalline silicon exposed surface for reducing thermal stress.

2. The method of claim 1, wherein the wafer of ultra-low expansion material is selected from the group of materials consisting of glass, plastic and ceramic.

3. The method of claim 1, additionally including a step of forming the wafer of ultra-low expansion material from a ceramic alloy consisting essentially of fused quartz and $TiO_2$.

4. The method of claim 3, additionally including a step of controlling the percentage of $TiO_2$ to adjust the coefficient of linear thermal expansion of the ceramic alloy.

5. The method of claim 1, additionally including controlling the coefficient of expansion of the wafer of ultra-low expansion material by controlling the composition of the material.

6. The method of claim 1, wherein the step of bonding is carried out by a technique selected from the group of bonding techniques consisting of anodic bonding, thermal compression bonding, and room temperature bonding.

7. The method of claim 1, wherein the steps of reducing and of polishing are carried out by chemical and/or mechanical polishing.

8. The method of claim 7, additionally including a step of further thinning the thickness of the crystalline silicon wafer to a thickness of about 5 µm, wherein the step of further thinning comprises an oxidation step followed by an etching step.

9. The method of claim 8, wherein the step of oxidation is carried out in an oxidation furnace.

10. The method of claim 8, wherein the step of etching is carried out with a buffered hydrofluoric acid etch.

11. A method for fabricating ULE/Si mask blanks, comprising:

bonding a wafer of crystalline silicon to a surface of a wafer of an ULE material by a technique selected from the group of techniques consisting of anodic bonding, thermal compression bonding and room temperature bonding;

thinning an exposed surface of the wafer of crystalline silicon to a thickness of between about 5 µm to about 10 µm; and forming a silicon oxide film on the crystalline silicon exposed surface for reducing thermal stress.

12. The method of claim 11, wherein the step of thinning is carried out by chemical and/or mechanical polishing.

* * * * *